United States Patent [19]

Maoz

[11] Patent Number: 4,864,162

[45] Date of Patent: Sep. 5, 1989

[54] VOLTAGE VARIABLE FET RESISTOR WITH CHOSEN RESISTANCE-VOLTAGE RELATIONSHIP

[75] Inventor: Barak Maoz, Highland Park, N.J.

[73] Assignee: Grumman Aerospace Corporation, Bethpage, N.Y.

[21] Appl. No.: 192,340

[22] Filed: May 10, 1988

[51] Int. Cl.$^4$ .................. H03K 17/14; H03K 17/687; H03K 5/01; H03K 3/86

[52] U.S. Cl. ................................ 307/296.1; 307/605; 307/304; 307/544; 307/550; 307/568; 307/303; 307/296.8; 323/313; 323/314

[58] Field of Search ............... 307/590, 594, 601, 603, 307/605, 606, 450, 451, 270, 279, 290, 576, 579, 574, 581, 296 R, 297, 296.1, 296.8, 550, 296 A, 530, 304, 568, 303, 303.2; 323/313, 314; 328/169-172; 333/17 L

[56] References Cited

U.S. PATENT DOCUMENTS

| | | | |
|---|---|---|---|
| 3,598,908 | 8/1971 | Poulett | 330/30 |
| 3,968,452 | 7/1976 | Sahara et al. | 330/29 |
| 3,977,291 | 8/1976 | Southard | 84/1.01 |
| 4,004,164 | 1/1977 | Cranford, Jr. et al. | 307/304 |
| 4,016,481 | 4/1977 | Bradley | 323/16 |
| 4,039,871 | 8/1977 | Ohashi et al. | 334/14 |
| 4,088,943 | 5/1978 | Schmidt | 307/304 X |
| 4,090,139 | 5/1978 | Hoover | 307/304 X |
| 4,093,909 | 6/1978 | Watrous et al. | 307/304 X |
| 4,121,183 | 10/1978 | Murphy | 333/81 R |
| 4,202,238 | 5/1980 | Moog | 84/1.27 |
| 4,241,316 | 12/1980 | Knapp | 330/277 |
| 4,244,043 | 1/1981 | Fujita et al. | 368/85 |
| 4,255,716 | 3/1981 | Takada | 330/284 |
| 4,257,064 | 3/1981 | Colles | 358/169 |
| 4,317,055 | 2/1982 | Yoshida et al. | 307/304 |
| 4,375,596 | 3/1983 | Hoshi | 307/297 |
| 4,395,643 | 7/1983 | Lehmann | 307/264 |
| 4,425,515 | 1/1984 | Larson | 307/268 |
| 4,496,909 | 1/1985 | Knapp | 330/277 |
| 4,546,651 | 10/1985 | Merrick | 73/701 |
| 4,549,098 | 10/1985 | Fushiki | 307/352 |
| 4,549,197 | 10/1985 | Brehm et al. | 357/41 |
| 4,555,788 | 11/1985 | Merrill | 375/11 |
| 4,562,362 | 12/1985 | Stenbock | 307/290 |
| 4,605,912 | 8/1986 | Naster et al. | 333/164 |
| 4,638,190 | 1/1987 | Hwang et al. | 307/512 |
| 4,646,028 | 2/1987 | Palmer | 330/277 |
| 4,649,291 | 3/1987 | Konishi | 307/304 X |
| 4,663,584 | 5/1987 | Okada et al. | 307/296 R X |
| 4,686,387 | 8/1987 | Rumelhard | 307/296 R |
| 4,686,451 | 8/1987 | Li et al. | 307/297 X |
| 4,688,113 | 8/1987 | Parsons | 360/67 |
| 4,700,462 | 10/1987 | Beaubien et al. | 437/187 |
| 4,701,722 | 10/1987 | Dolby | 333/14 |
| 4,719,434 | 1/1988 | Scott et al. | 333/32 |

FOREIGN PATENT DOCUMENTS 122313 3/1987 Japan.

OTHER PUBLICATIONS

Lizama, G. et al., 1-6 GHz GaAs MMIC Linear Attenuator with Integral Drivers, IEEE 1987 Microwave and Millimeter-Wave Monolithic Circuits Symposium.

Fisher, D. et al., A Linear GaAs MMIC Variable Attenuator, RF Design.

*Primary Examiner*—Stanley D. Miller
*Assistant Examiner*—David R. Bertelson
*Attorney, Agent, or Firm*—Scully, Scott, Murphy & Presser

[57] ABSTRACT

A voltage variable FET resistor includes a FET network comprising a plurality of FET segments each of which have a predetermined gate width and a voltage divider network including a plurality of fixed resistors coupled to the gates of the plurality of FET segments for providing a different gate width of each of the FET segments and the resistance of each of the fixed resistors is chosen to provide a predetermined relationship between the control voltage and the channel resistance of the voltage variable FET resistor.

15 Claims, 5 Drawing Sheets

VOLTAGE VARIABLE FET RESISTOR WITH CHOSEN RESISTANCE-VOLTAGE RELATIONSHIP

BACKGROUND OF THE INVENTION

This invention relates to field effect transistors and more particularly, to monolithic field effect transistors acting as voltage controlled variable resistors.

The use of a field effect transistor (FET) as a voltage controlled variable resistor is well known. There is a region in the characteristic curve of a FET for small values of the drain to source voltage $V_{DS}$, where the drain current $I_D$ varies linearly with $V_{DS}$. The $V_{DS}$ value must be smaller than the gate to source voltage $V_{GS}$ less the threshold or pinch off voltage $V_T$, i.e. $(V_{GS} - V_T)$. The linear relationship between voltage and current allows the FET to be used as a voltage controlled variable resistor. In the linear region, the FET acts as a resistor whose value can be controlled by the gate voltage. The drain can be kept either positive or negative with respect to the source when using the FET in this mode, which gives the FET the bilateral property of an ordinary resistor. The resistance $R_{DS}$ of the FET in the linear region is given by $$R_{DS} = \frac{V_T^2}{2I_{DSS}\left(V_{GS} - V_T - \frac{V_{DS}}{2}\right)} \quad (1)$$

The relationship shows the dependence of the resistance $R_{DS}$ on $V_{GS}$. FIG. 1 is a plot of equation 1 showing the relationship between $R_{DS}$ and $V_{GS}$ for a typical single FET designed for use as a voltage controlled resistor. As a negative voltage applied to the gate is increased, the resistance varies substantially linearly between 0.0 and $-2.0$ volts until pinch-off at approximately $-4.0$ volts.

The characteristics of individual FETs fabricated in monolithic form are proportional to the gate width and other manufacturing parameters. While the characteristics may vary slightly for individual FETs, the relationship between the resistance and the gate voltage is always in accordance with equation 1. The curve as shown in FIG. 1 may be moved up and down or compressed and expanded, by manufacturing the FET with a gate width that will yield the desired channel resistance. However, the resistance-voltage relationship will remain in accordance with equation 1. In the many applications for voltage controlled variable FET resistors, such as in an automatic gain control circuit, there is often a need for a variable resistor having a voltage versus resistance relationship different than that of equation 1.

An example in the prior art of a monolithic FET used as a voltage variable resistor is described by Fisher et al., "A Linear GaAs MMIC Variable Attenuator", RF Design, October 1987. Fisher teaches the use of three single FETs having a gate width based on a trade off between insertion loss and parasitic capacitance. In addition, complicated external analog control circuitry is required to apply the desired gate voltages to each FET. The control circuitry includes active components requiring D.C. power to drive the circuit.

Another prior art use of a FET resistor is disclosed by Lizama, et al., "1–6 GHz GaAs MMIC Linear Attenuator With Integral Drivers", IEEE 1987 Microwave and Millimeter-Wave Monolithic Circuits Symposium. Lizama, et al. uses two FETs in parallel of different gate widths to provide improved linearity of attenuation. Lizama, et al. uses a complex integrated driver circuit consisting of active elements to provide the various gate voltages, that consumes D.C. power and is sensitive to temperature variations and process changes.

SUMMARY OF THE INVENTION

The present invention is directed to a field effect transistor used as a voltage controlled variable resistor having a chosen resistance versus voltage relationship. The voltage variable FET resistor of the invention includes a FET network comprising a plurality of FET segments having source, drain and gate electrodes. The individual FET segments of the FET network are electrically coupled in parallel to each other. The drain electrodes of each of the FET segments are coupled to an output terminal of the FET network and the source electrodes of each of the FET segments are coupled to an input terminal of the FET network. The gate electrodes of each of the FET segments are coupled to a control voltage terminal of the voltage variable FET resistor upon which a control voltage is applied. The voltage variable FET resistor of the invention also includes a voltage divider network coupled to the gate electrodes and the control voltage terminal. The voltage divider network divides the control voltage to provide a different predetermined gate voltage to the gate electrode of each FET segment.

The plurality of FET segments are connected in parallel and therefore, the resistance measured between the output and input terminals of the FET network is the equivalent resistance of the channel resistances between the source and drain of each of the FET segments. The channel resistance of each FET segment is inversely proportional to the gate width of each gate electrode. The gate electrode of each of the FET segments has a predetermined gate width which is selected to provide the desired resistance-voltage relationship of the voltage variable FET resistor in a manner to be described hereinafter.

By providing the individual FET segments with different gate widths, each FET segment will have a different relationship between the voltage applied to the gate and the channel resistance. Each of the individual FET segments of the FET network has a channel resistance that is variable as a function of the different gate voltage applied to the FET segment by the voltage divider network. In addition, the range in which the channel resistance varies is a function of the predetermined gate width of each of the FET segments. Thus, in accordance with the invention, the relationship between the resistance measured between the output and input terminals and the control voltage is determined by varying the gate widths of the plurality of FET segments and the gate voltages applied to each of the FET segments.

The variation in the gate widths of the FET segments is provided by fabricating the voltage variable FET resistor of the invention with each FET segment having a predetermined gate width. Typically, the gate width of at least one of the FET segments is different from the gate width of at least one other of the FET segments. The variation in the gate voltages applied to the FET segments is made by the design of the voltage divider network. The voltage divider network includes a plurality of fixed resistors with at least one resistor coupled to the gate of each FET segment. In a voltage variable FET resistor of the invention having n FET segments, where n is greater than or equal to 2, the voltage divider network will include n fixed resistors. The voltage divider network is formed with the $n^{th}-1$ resistor connected between the gate electrodes of the $n^{th}-1$ and the $n^{th}$ FET segment. The $n^{th}$ resistor connected between the gate electrode of the $n^{th}$ FET segment and a common or ground terminal. The values of the fixed resistors are selected to divide the control voltage and for providing the desired gate voltage to each of the FET segments. The voltage divider network is a passive circuit that does not require any D.C. power to provide the desired gate voltages, apart for a small current that depends on the resistor values.

The present invention is implemented in monolithic technology due to the greater control in fabricating the FET segments of varying gate widths. In one embodiment, the FET segments are metal semiconductor field effect transistors (MESFET) having a Shottky gate and using interdigitated source, drain and gate electrodes. For microwave frequency operation, the FET should be fabricated on a gallium arsenide (GaAs) substrate. At lower frequencies, silicon may be used. The voltage divider resistors can be integrated monolithically on the same chip, and are much simpler to implement than the prior art control circuitry.

The voltage controlled variable FET resistor of the invention may be utilized in any application requiring a desired control voltage versus resistance relationship. One application is in a voltage variable attenuator, such as that disclosed in a co-pending U.S. patent application Ser. No. 192,193 by the same inventor as the within application and assigned to the same assignee as the present application, said application being filed concurrently herewith.

DETAILED DESCRIPTION OF THE PREFERRED EMBODIMENT

Figure 1:
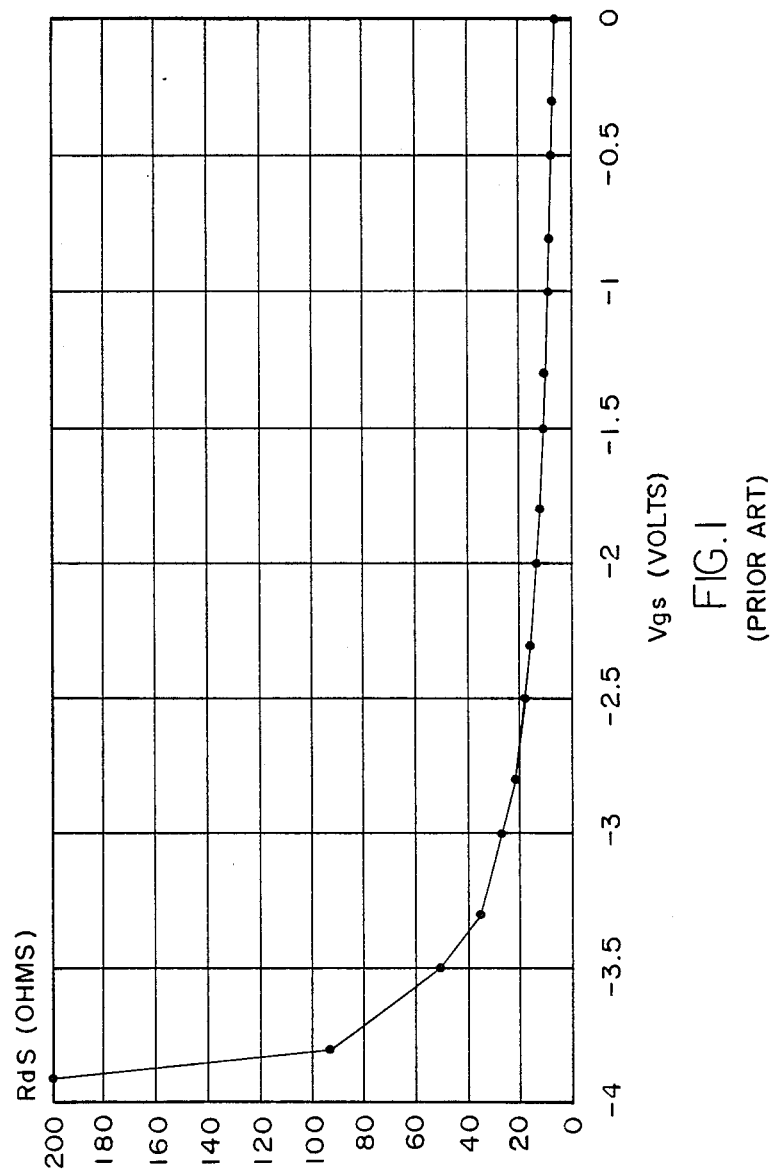
FIG. 1 is a graph showing the resistance versus voltage relationship of a single voltage variable FET of the prior art.
Figure 2:
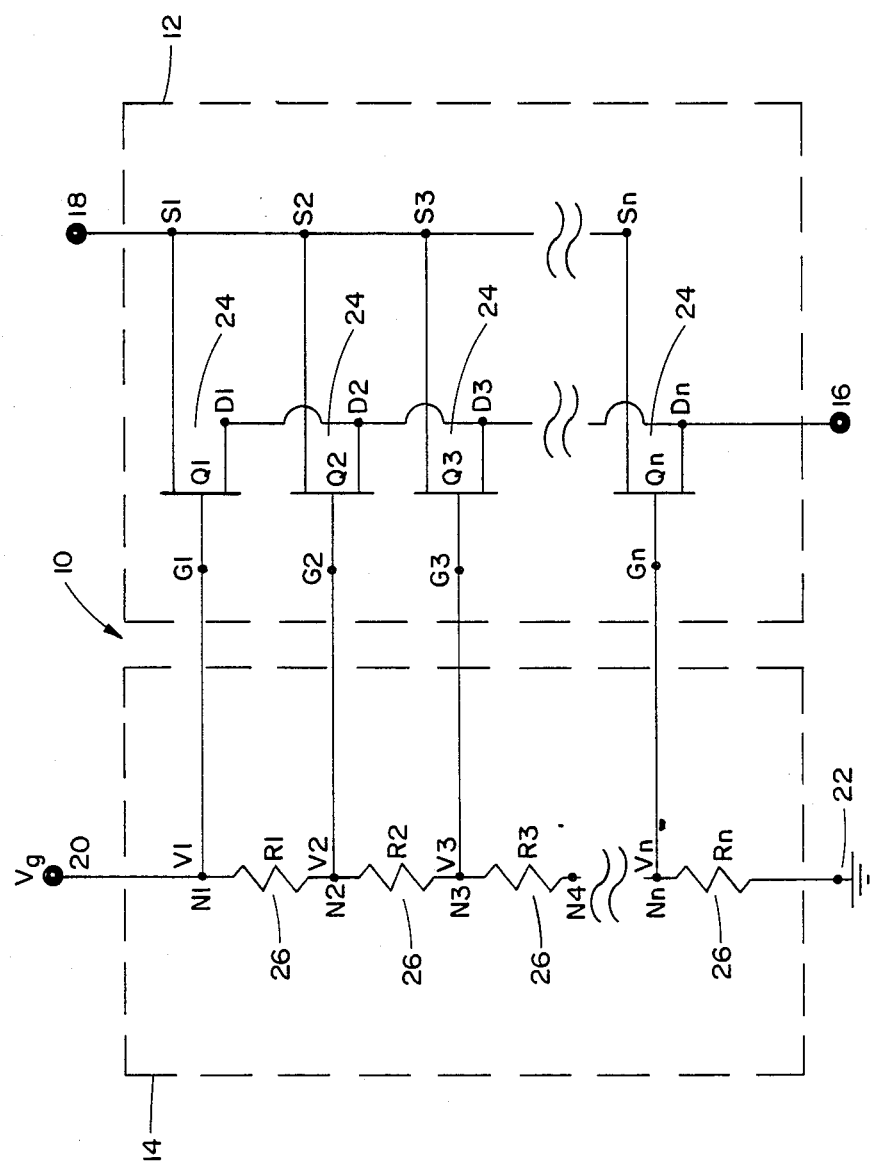
FIG. 2 is a schematic circuit diagram of the voltage controlled variable FET resistor of the present invention.

The voltage controlled variable FET resistor of the present invention has a flexibility in design to allow the selection of almost any channel resistance versus control voltage relationship desired. FIG. 2 shows a schematic circuit diagram of the voltage variable FET resistor 10 of the invention comprising a FET network 12 coupled to a voltage divider network 14. The FET network 12 includes an input terminal 16 and an output terminal 18. The voltage divider network 14 is coupled to a voltage control terminal 20 and to a ground terminal 22.

The FET network 12 comprises a plurality of FET segments 24 having source (S), drain (D) and gate (G) electrodes. The FET segments 24 are designated $Q_1$, $Q_2$, $Q_3 \ldots Q_n$ and have source, drain and gate electrode designed $S_1$, $S_2$, $S_3 \ldots S_n$; $D_1$, $D_2$, $D_3 \ldots D_n$; and $G_1$; $G_2$, $G_3 \ldots G_n$, respectively. The number, n, of FET segments in the FET network 12 is determined in accordance with the particular application and desired voltage-resistance relationship of the FET resistor 10.

Each of the FET segments 24 in the FET network 12 are coupled in parallel across their respective source and drain electrodes. Accordingly, all the source electrodes $S_1$, $S_2$, $S_3 \ldots S_n$ are coupled together to output terminal 18, and all the drain electrodes $D_1$, $D_2$, $D_3 \ldots D_n$ are coupled together to input terminal 16.

The voltage divider network 14 includes a plurality of fixed resistors 26 coupled to the gate electrodes of the FET segments 24 between control terminal 20 and ground terminal 22. The gate electrodes $G_1$, $G_2$, $G_3 \ldots G_n$ are coupled to the voltage divider network 14 at nodes $N_1$, $N_2$, $N_3 \ldots N_n$. Resistor R1 of the plurality resistors 26 is coupled between node $N_1$ and $N_2$. Similarly, resistor R2 is coupled between nodes $N_2$ and $N_3$ and resistor R3 is connected between nodes $N_3$ and $N_4$. Resistor $R_n$ is connected between node $N_n$ and ground terminal 22.

As stated above, a field effect transistor operating in the linear range of its I–V characteristic curve acts as a voltage controlled variable resistor. The resistance measured between the source and drain electrodes varies in accordance with the voltage applied to the gate of the transistor. In addition, the range of resistance values is dependent upon manufacturing parameters and in particular, the width of the gate of the FET. Each of the FET segments 24 in the network 12 have a predetermined gate width resulting in a predetermined channel resistance measured between the source and drain of each FET segment. The FET network 12 includes at least two or more FET segments 24 in which the gate width of at least one of the FET segments 24 is different from the gate width of at least one other of the FET segments 24.

The FET segments 24, are connected in parallel and therefore the resistance of the FET resistor 10 measured between terminals 16 and 18 is the equivalent resistance of the FET segments determined by the parallel resistance formula:

$$\frac{1}{R_{DS}} = \frac{1}{R_{DS1}} + \frac{1}{R_{DS2}} + \frac{1}{R_{DS3}} + \ldots + \frac{1}{R_{DSn}} \quad (2)$$

A control voltage $V_G$ applied to the control terminal 20 will be divided by the voltage divider network 14 to provide a different voltage to each of the gates of the FET segments 24. The individual gate voltages are designated $V_1$, $V_2$, $V_3 \ldots V_n$, where $V_1$ equals $V_G$. The individual gate voltages can be derived directly by using the voltage divider formula $$V_i = \frac{V_G \times (R_i + R_{i+1} + \ldots + R_n)}{R_1 + R_2 + R_3 + \ldots + R_n} \quad (3)$$

where $i = 1, 2 \ldots n$.

As a result of the different gate voltages applied to each of the FET segments 24, each FET segment 24 will have a different relationship between $V_G$ and the resistance measured between the source and drain of each FET segment 24. Since the source and drain terminals of each of the FET segments 24 are connected in parallel, the resulting resistance of the complete voltage variable FET resistor 10 can be made to match a specified relationship by changing the number of FET segments 24, the width of each of the FET segments 24 and the voltage divider network 14 resistance values.

Figure 3:
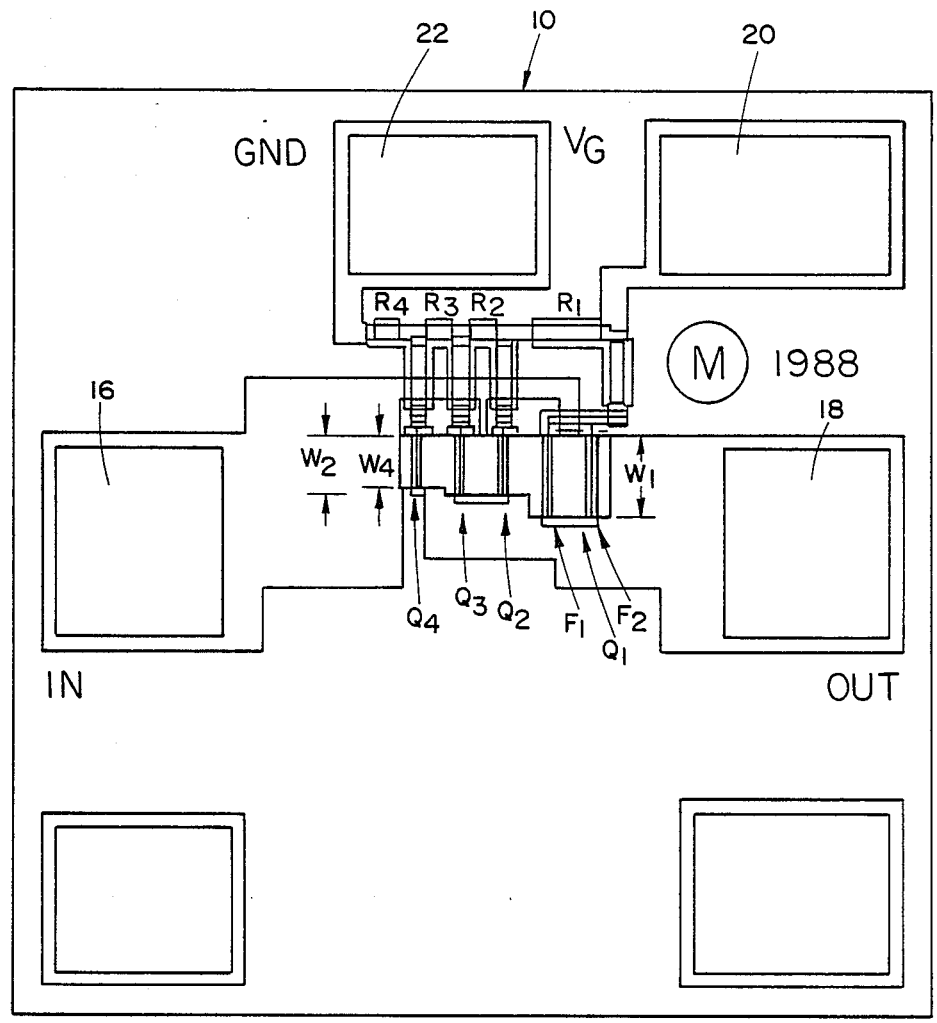
FIG. 3 is a "calma" layout, describing a plan view of the voltage controlled variable FET resistor of the present invention in monolithic form.

Referring now to FIG. 3, the voltage variable FET resistor 10 is shown in monolithic form. The plurality of FET segments 24 are formed on a semiconducting substrate, such as GaAs from electrodes having an interdigitated construction. In the illustrative monolithic embodiment of FIG. 3, the FET segment $Q_1$ is shown with a gate width $2W_1$. FET segment $Q_1$ is a split FET which is made of two segments $F_1$ and $F_2$ coupled to the same metal strip thus connecting the two segments in parallel. The effective gate width of FET segment $Q_1$ is equal to the gate width of segment $F_1$ plus the gate width of segment $F_2$. FET segment $Q_2$ and $Q_3$ have a gate width of $W_2$ and FET segment $Q_4$ has a gate width $W_4$. Resistors $R_1$, $R_2$, $R_3$ and $R_4$ are connected as shown to the gates of FET segments $Q_1-Q_4$, between control terminal contact pad 20 and ground terminal contact pad 22. The drain electrodes of the FET segments $Q_1-Q_4$ are connected to input contact pad 16 and the source electrodes of the FET segments $Q_1-Q_4$ are connected to output terminal contact pad 18.

In implementing the invention, the desired voltage-resistance relationship necessary for a particular application is first determined. The desired relationship may be based on the need to have the resistance between the input and output terminals of the FET resistor 10 vary in a particular manner upon the application and change of the control voltage $V_G$. By using a combination of the known equivalent parallel resistance formula and the voltage divider formula of equation 3, one skilled in the art can determine the number of FET segments of the FET network 12, the required gate width for each of the FETs and the resistance values for the voltage divider network 14 to construct a voltage controlled variable FET resistor having the desired voltage-resistance relationship. A computer simulation program may be used to simulate the resistance-voltage relationship of FET resistor 10 for various combinations of gate widths and fixed resistor values to assist in ascertaining the optimal combination.

The following is a table of values for the implementation of the FET resistor 10 of the invention shown in FIG. 3.

TABLE

| RESISTANCE | GATE WIDTHS |
|---|---|
| $R_1$ = 4.5k ohms | $W_1$ = 110 microns (2 × 55) |
| $R_2$ = 1.9k ohms | $W_2$ = 40 microns |
| $R_3$ = 1.7k ohms | $W_3$ = 40 microns |
| $R_4$ = 1.6k ohms | $W_4$ = 35 microns |

Figure 4:
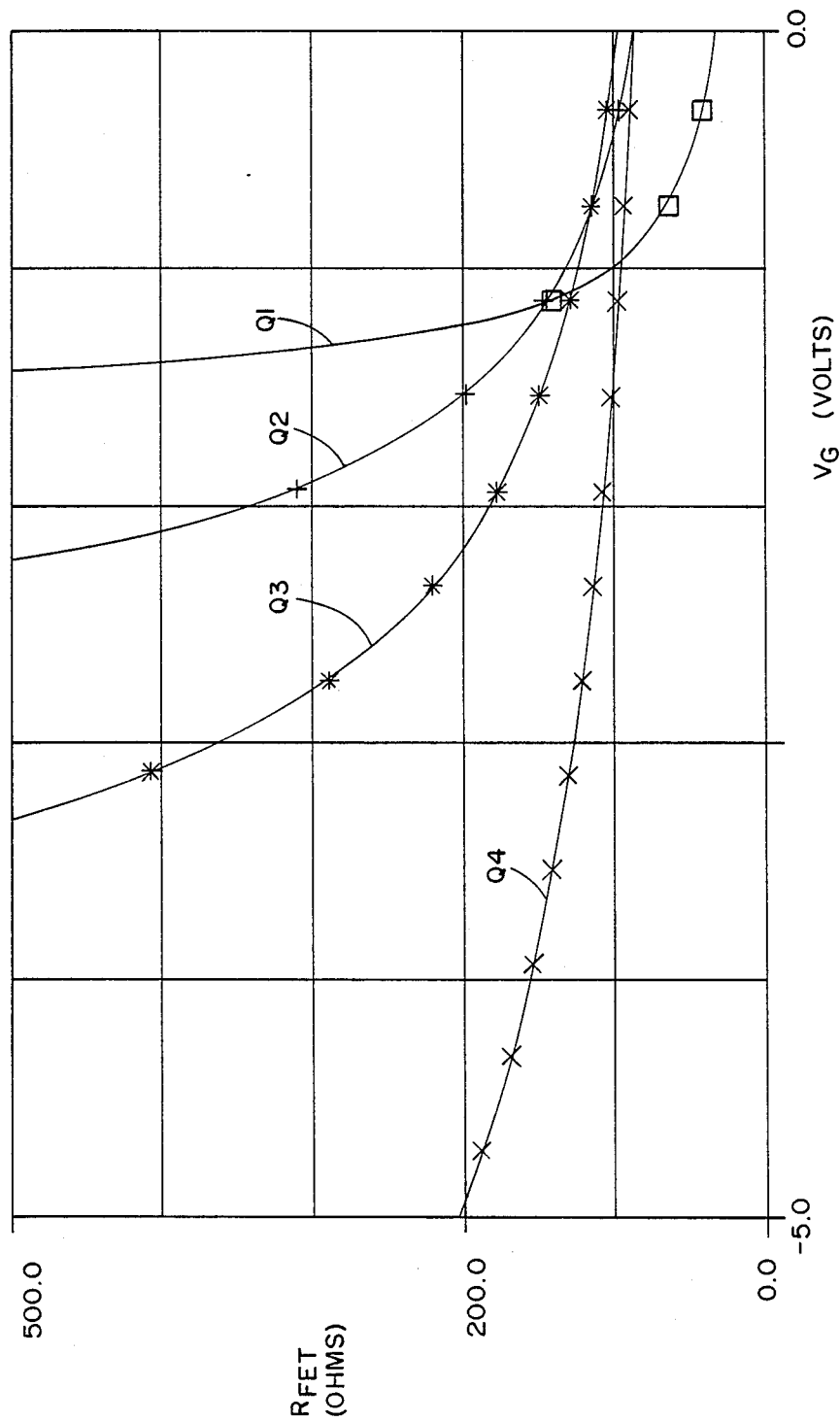
FIG. 4 is a graph showing the gate voltage versus resistance relationships of each of the individual FET segments of a voltage controlled variable FET resistor of the present invention.
Figure 5:
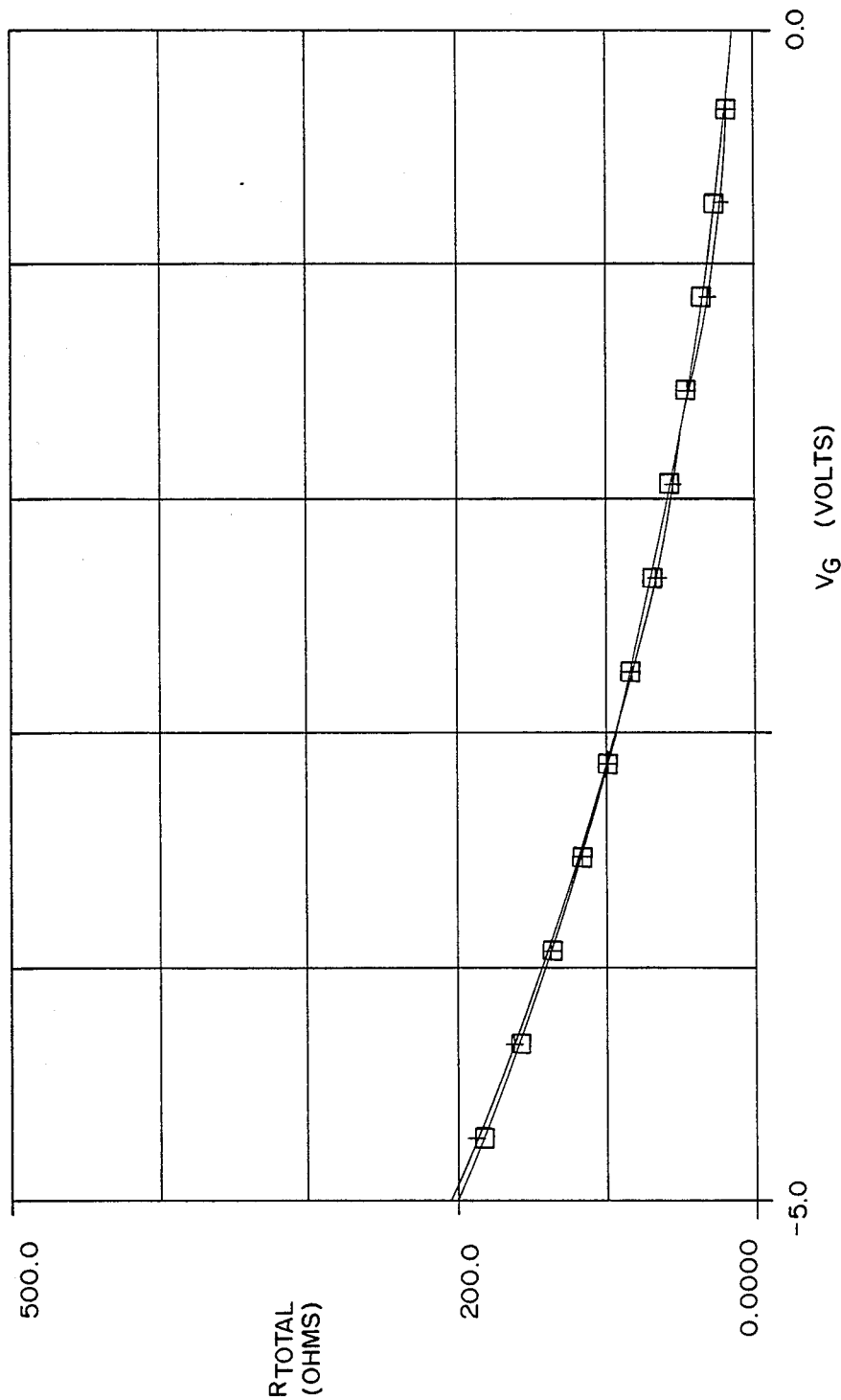
FIG. 5 is a graph showing the resistance versus voltage relationship of a voltage controlled variable FET resistor of the present invention.

FIG. 4 is a graph showing the relationships between voltage and channel resistance for each of the individual FET segments $Q_1-Q_4$. For a control voltage in the range of 0.0 to $-5.0$ volts, the resistance for each FET segment varies in accordance with each of the plots shown. The size of the gate width affects the channel resistance in a manner such that a larger width will produce a smaller resistance. As the channels are coupled in parallel, in accordance with Ohms Law, a smaller parallel resistance will have a larger contribution to the equivalent resistance. The resistors of the voltage divider 14 determine when each FET segment will reach pinch off state. Once a FET segment reaches pinch off, the resistance becomes very large and no longer contributes to the equivalent resistance. As shown in FIG. 4, between 0.0 and $-1.0$ volts, all four of the FET segments have values that contribute to the equivalent resistance. However, between $-3.0$ and $-4.0$ volts, only $Q_3$ and $Q_4$ contribute and between $-4.0$ and $-5.0$ volts only $Q_4$ will contribute. FIG. 5 is a graph showing the equivalent resistance of the complete FET resistor 10 as a function of the control voltage. Thus, in accordance with the invention, the relationship between the resistance measured between the output and input terminals and the control voltage may be determined by varying the number of FET segments, the gate widths of the FET segments and the gate voltages applied to the FET segments.

While illustrative embodiments of the subject invention have been described and illustrated, it is obvious that various changes and modifications can be made therein without departing from the spirit of the present invention which should be limited only by the scope of the appended claims.

What is claimed is:

1. A voltage variable FET resistor comprising:
    a FET network comprising a plurality of FET segments having source, drain and gate electrodes, the drain electrode of each of the plurality of FET segments being coupled to an output terminal, the source electrode of each of the plurality of FET segments being coupled to an input terminal and the gate electrodes of each of the plurality of FET segments being coupled to a control voltage terminal, each of said plurality of FET segments having a predetermined gate width; and
    a voltage divider network coupled to said gate electrodes of said plurality of FET segments for providing a different predetermined gate voltage to each of said gate electrodes.

2. The voltage variable FET resistor of claim 1 wherein the gate width of at least one of the plurality of FET segments is different from the gate width of at least one other of said plurality of FET segments.

3. The voltage variable FET resistor of claim 2 wherein said voltage divider network includes a plurality of fixed resistors, at least one of said plurality of fixed resistors being coupled to each of the gate electrodes.

4. The voltage variable FET resistor of claim 3 wherein said plurality of FET segments includes n FET segments, wherein n≧2, said plurality fixed resistors includes n resistors and wherein the $n^{th}-1$ resistor is connected between the gate electrode of the $n^{th}-1$ and the $n^{th}$ FET segment and the $n^{th}$ resistor is connected between the gate electrode of the $n^{th}$ FET segment and a ground terminal.

5. The voltage variable FET resistor of claim 4 wherein each of the n FET segments have a drain electrode to source electrode channel resistance variable as a function of a voltage applied to the gate electrode of each of the n FET segments and as a function of the predetermined gate width of each of the n FET segments.

6. The voltage variable FET resistor of claim 5 wherein the gate width of each of the n FET segments and the resistance of each of the n resistors is chosen to provide a predetermined relationship between the control voltage applied to said control voltage terminal and the resistance measured between the input and output terminals.

7. The voltage variable FET resistor of claim 6 wherein said FET network and said voltage divider network are implemented in a monolithic integrated circuit formed on a monolithic semiconductor substrate.

8. The voltage variable FET resistor of claim 7 wherein said monolithic semiconductor substrate comprises one of GaAs and Si.

9. A monolithic voltage variable FET resistor having a predetermined resistance-voltage relationship, said FET resistor comprising:
a FET network comprising a plurality of FET segments having source, drain and gate electrodes, the drain electrode of each of the plurality of FET segments being coupled to an output terminal, the source electrode of each of the plurality of FET segments being coupled to an input terminal and the gate electrode of each of the plurality of FET segments being coupled to a control voltage terminal, each of said plurality of FET segments having a predetermined gate width; and
a voltage divider network coupled to said gate electrodes of said plurality of FET segments for providing a different predetermined gate voltage to each gate electrode;
whereby the relationship between the resistance measured between the output and input terminals and a control voltage applied to the control voltage terminal is predetermined by varying the gate widths of said plurality of FET segments and the gate voltages provided to each of said plurality of FET segments.

10. The voltage variable FET resistor of claim 9 wherein the gate width of at least one of the plurality of FET segments is different from the gate width of at least one other of said plurality of FET segments.

11. The voltage variable FET resistor of claim 10 wherein said voltage divider network includes a plurality of fixed resistors, at least one of said plurality of fixed resistors being coupled to each of the gate electrodes of said plurality of FET segments.

12. The voltage variable FET resistor of claim 11 wherein said plurality of FET segments includes n FET segments, wherein $n \geq 2$, said plurality fixed resistors includes n resistors and wherein the $n^{th}-1$ resistor is connected between the gate electrode of the $n^{th}-1$ and the $n^{th}$ FET segment and the $n^{th}$ resistor is connected between the gate electrode of the $n^{th}$ FET segment and a ground terminal.

13. The voltage variable FET resistor of claim 12 wherein each of the n FET segments having a drain electrode to source electrode channel resistance variable as a function of a voltage applied to the gate electrode of each of the n FET segment and as a function of the predetermined gate width of each of the n FET segments.

14. The voltage variable FET resistor of claim 13 wherein said FET network and said voltage divider network are implemented in a monolithic integrated circuit formed on a monolithic semiconductor substrate.

15. The voltage variable FET resistor of claim 14 wherein said monolithic semiconductor substrate comprises one of GaAs and Si.

* * * * *

REEXAMINATION CERTIFICATE (1808th)
United States Patent [19]
Maoz

[11] B1 4,864,162
[45] Certificate Issued Oct. 13, 1992

[54] VOLTAGE VARIABLE FET RESISTOR WITH CHOSEN RESISTANCE-VOLTAGE RELATIONSHIP

[75] Inventor: Barak Maoz, Highland Park, N.J.

[73] Assignee: Grumman Aerospace Corporation, Bethpage, N.Y.

Reexamination Request:
No. 90/002,574, Feb. 14, 1992

Reexamination Certificate for:
Patent No.: 4,864,162
Issued: Sep. 5, 1989
Appl. No.: 192,340
Filed: May 10, 1988

[51] Int. Cl.[5] .................. H03K 17/14; H03K 17/687; H03K 5/01; H03K 3/86
[52] U.S. Cl. .............................. 307/296.1; 307/605; 307/304; 307/544; 307/550; 307/568; 307/303; 307/296.8; 323/313; 323/314; 338/20; 338/320

[58] Field of Search ............... 307/304, 568, 296.8, 307/264, 501; 330/284; 338/20, 22 SD, 319, 320

[56] References Cited

U.S. PATENT DOCUMENTS

| | | | |
|---|---|---|---|
| 4,317,055 | 2/1982 | Yoshida et al. | 307/304 |
| 4,496,909 | 1/1985 | Knapp | 330/277 |
| 4,663,584 | 5/1987 | Okada et al. | 323/313 |
| 4,686,387 | 8/1987 | Rumelhard | 307/296.8 |

FOREIGN PATENT DOCUMENTS

| | | | |
|---|---|---|---|
| 53-78782 | 12/1978 | Japan | 307/304 |

*Primary Examiner*—John S. Heyman

[57] ABSTRACT

A voltage variable FET resistor includes a FET network comprising a plurality of FET segments each of which have a predetermined gate width and a voltage divider network including a plurality of fixed resistors coupled to the gates of the plurality of FET segments for providing a different gate width of each of the FET segments and the resistance of each of the fixed resistors is chosen to provide a predetermined relationship between the control voltage and the channel resistance of the voltage variable FET resistor.

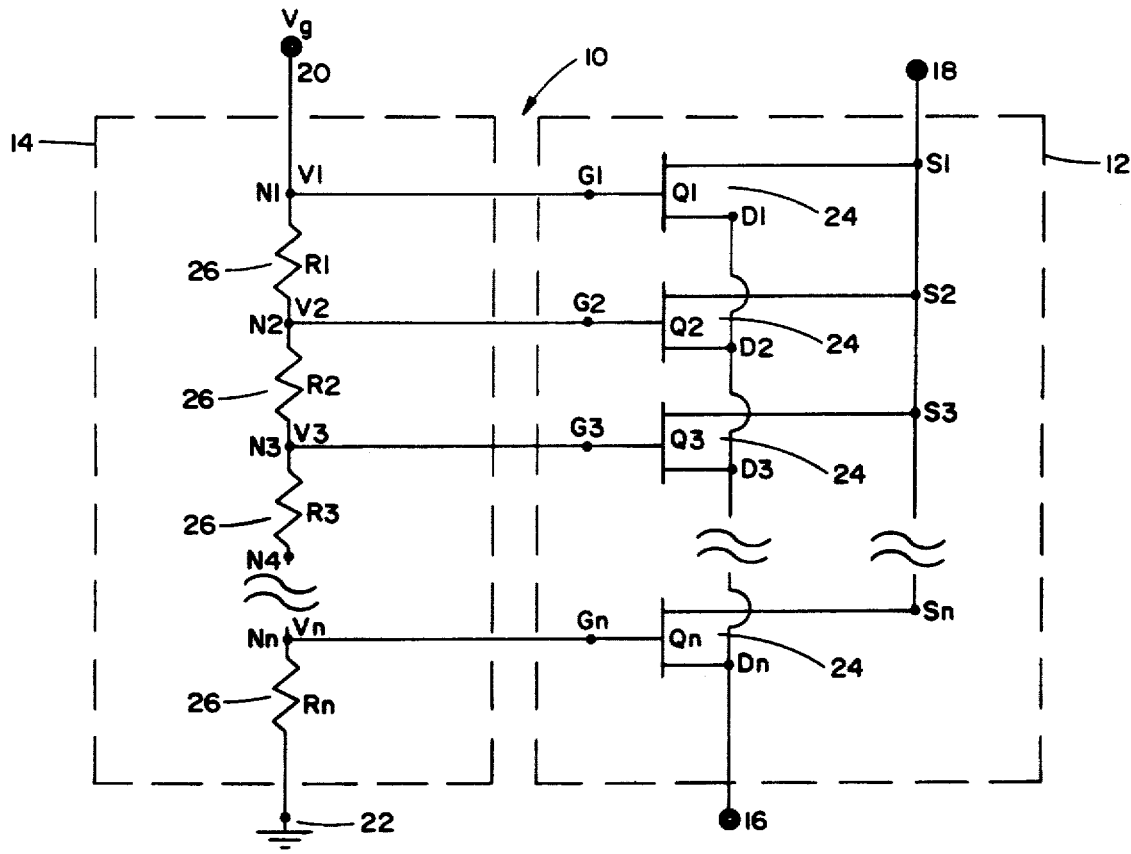

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

ONLY THOSE PARAGRAPHS OF THE SPECIFICATION AFFECTED BY AMENDMENT ARE PRINTED HEREIN.

Column 3 line 60 to column 4 line 2:

The voltage controlled variable FET resistor of the present invention has a flexibility in design to allow the selection of almost any channel resistance versus control voltage relationship desired. FIG. 2 shows a schematic circuit diagram of the voltage variable FET resistor 10 of the invention comprising a FET network 12 coupled to a voltage divider network 14. The FET network 12 includes an [input] *output* terminal 16 and an [output] *input* terminal 18. The voltage divider network 14 is coupled to a voltage control terminal 20 and to a ground terminal 22.

Column 4 lines 12-17:

Each of the FET segments 24 in the FET network 12 are coupled in parallel across their respective source and drain electrodes. Accordingly, all the source electrodes $S_1, S_2, S_3 \ldots S_n$ are coupled together to [output] *input* terminal 18, and all the drain electrodes $D_1, D_2, D_3 \ldots D_n$ are coupled together to [input] *output* terminal 16.

Column 5 lines 10-29:

Referring now to FIG. 3, the voltage variable FET resistor 10 is shown in monolithic form. The plurality of FET segments 24 are formed on a semiconducting substrate, such as GaAs from electrodes having an interdigitated construction. In the illustrative monolithic embodiment of FIG. 3, the FET segment $Q_1$ is shown with a gate width $2W_1$. FET segment $Q_1$ is a split FET which is made of two segments $F_1$ and $F_2$ coupled to the same metal strip thus connecting the two segments in parallel. The effective gate width of FET segment $Q_1$ is equal to the gate width of segment $F_1$ plus the gate width of segment $F_2$. FET segment $Q_2$ and $Q_3$ have a gate width of $W_2$ and FET segment $Q_4$ has a gate width $W_4$. Resistors $R_1, R_2, R_3$ and $R_4$ are connected as shown to the gates of FET segments $Q_1-Q_4$, between control terminal contact pad 20 and ground terminal contact pad 22. The drain electrodes of the FET segments $Q_1-Q_4$ are connected to input contact pad 16 and the source electrodes of the FET segments $Q_1-Q_4$ are connected to [output] *input* terminal contact pad 18.

AS A RESULT OF REEXAMINATION, IT HAS BEEN DETERMINED THAT:

Claims 1 and 9 are determined to be patentable as amended.

Claim 2-8 and 10-15, dependent on an amended claim, are determined to be patentable.

1. A voltage variable FET resistor comprising:

a FET network comprising a plurality of FET segments having source, drain and gate electrodes, the drain electrode of each of the plurality of FET segments being coupled to an output terminal, the source electrode of each of the plurality of FET segments being coupled to an input terminal and the gate electrodes of each of the plurality of FET segments being coupled to a control voltage terminal, each of said plurality of FET segments having a predetermined gate width; and a voltage divider network coupled *between a power source and a reference potential and* to said gate electrodes of said plurality of FET segments for providing a different predetermined gate voltage to each of said gate electrodes.

9. A monolithic voltage variable FET resistor having a predetermined resistance-voltage relationship, said FET resistor comprising:

a FET network comprising a plurality of FET segments having source, drain and gate electrodes, the drain electrode of each of the plurality of FET segments being coupled to an output terminal, the source electrode of each of the plurality of FET segments being coupled to an input terminal and the gate electrode of each of the plurality of FET segments being coupled to a control voltage terminal, each of said plurality of FET segments having a predetermined gate width; and a voltage divider network coupled *between a power source and a reference potential and* to said gate electrodes of said plurality of FET segments for providing a different predetermined gate voltage to each gate electrode;

whereby the relationship between the resistance measured between the output and input terminals and a control voltage applied to the control voltage terminal is predetermined by varying the gate widths of said plurality of FET segments and the gate voltages provided to each of said plurality of FET segments.

* * * * *